(12) United States Patent
Wikstrom

(10) Patent No.: US 6,666,980 B1
(45) Date of Patent: Dec. 23, 2003

(54) METHOD FOR MANUFACTURING A RESISTOR

(75) Inventor: Bo Wikstrom, Asmundtorp (SE)

(73) Assignee: Obducat AB, Malmo (SE)

( * ) Notice: Subject to any disclaimer, the term of this patent is extended or adjusted under 35 U.S.C. 154(b) by 279 days.

(21) Appl. No.: 09/653,943

(22) Filed: Sep. 1, 2000

Related U.S. Application Data

(63) Continuation of application No. PCT/SE99/00325, filed on Mar. 5, 1999.

(30) Foreign Application Priority Data

Mar. 5, 1998 (SE) .............................................. 9800707

(51) Int. Cl.$^7$ ................................................. G23F 1/02
(52) U.S. Cl. ............................ 216/16; 216/37; 216/86; 216/100; 205/643
(58) Field of Search ............................. 216/13, 16, 37, 216/96; 205/103, 643

(56) References Cited

U.S. PATENT DOCUMENTS

| | | | | |
|---|---|---|---|---|
| 4,345,465 A | * | 8/1982 | Gruner et al. ................. | 338/28 |
| 5,074,629 A | * | 12/1991 | Zdeblick ...................... | 385/14 |
| 5,356,756 A | * | 10/1994 | Cavicchi et al. ............. | 430/315 |

FOREIGN PATENT DOCUMENTS

| | | |
|---|---|---|
| EP | 0 163 760 | 12/1985 |
| EP | 0 719 079 | 6/1996 |
| EP | 0 837 623 | 4/1998 |
| WO | WO 98/10121 | 3/1998 |

OTHER PUBLICATIONS

IBM Technical Disclosure Bulletin, "Decoupling Capacitor Incorporated in Printed Circuit Board", IBM Corp., vol. 33, No. 10A,. Mar., 1991.

* cited by examiner

*Primary Examiner*—Allan Olsen
(74) *Attorney, Agent, or Firm*—Finnegan, Henderson, Farabow, Garrett & Dunner, L.L.P.

(57) ABSTRACT

A method for manufacturing a resistor function in an electric conductor on the surface of a carrier, preferably a conductor on printed circuit boards, substrates and chips. By etching using an anisotropic etching technique, the conductor is provided with at least one portion which has a smaller cross-sectional area than the conductor surrounding the portion, the length and width of the portion being such that a predetermined resistance is obtained in the conductor. A resistor according to the invention is on both sides connected to a conductor on a carrier, such as a printed circuit board, a substrate or a chip. The resistor comprises a conductor portion positioned on the carrier and having a significantly smaller cross-sectional area than the conductor on both sides of the resistor.

5 Claims, 3 Drawing Sheets

METHOD FOR MANUFACTURING A RESISTOR

This application is a Continuation of International Application Number PCT/SE99/00325, filed Mar. 5, 1999, the content of which is incorporated herein by reference.

FIELD OF THE INVENTION

The present invention relates to a resistor and a method for manufacturing a resistor on carriers, preferably printed circuit boards, substrates and chips with or without integrated circuits, in the field of electronics.

BACKGROUND ART

Printed circuit boards, substrates or chips have conductor structures on their surfaces or inside to connect other components, integrated functions or to connect to the surroundings. If resistor components are required, they are mounted as discrete components or applied as resistor pastes to printed circuit boards, substrates or chips so as to achieve the necessary resistance.

This is a time-consuming and complicated process. Therefore there is a need for a process which facilitates the manufacture of resistors.

SUMMARY OF THE INVENTION

An object of the present invention is to overcome the above drawbacks and render the realisation of the resistor function in electronic products such as printed circuit boards, substrates and chips more effective.

These objects are achieved by a resistor and a method according to the appended claims.

A method for manufacturing a resistor function in an electric conductor on the surface of a carrier, preferably conductors on printed circuit boards, substrates and chips, according to the invention is characterised in that the conductor, by etching using an anisotropic etching technique, is provided with at least one portion which has a smaller cross-sectional area than the conductor on both sides of the portion, the length and width of the portion being such that a predetermined resistance is obtained in the conductor.

A resistor which on both sides is connected to a conductor on a carrier, such as a printed circuit board, a substrate or a chip, according to the invention is characterised in that the resistor comprises a conductor portion which is positioned on the carrier and which has a significantly smaller cross-sectional area than the conductor on both sides of the resistor.

By a significantly smaller cross-sectional area is meant that the cross-sectional area is smaller than 20%, preferably smaller than 5% of the cross-sectional area of the conductor.

A method according to the invention is based on the use of an anisotropic etching technique to generate conductor structures having a desired resistance.

By the resistor function being achieved by the conductor being provided with a portion of a smaller cross-sectional area, the resistor function can be made at the same time as the conductor structure on, for instance, a printed circuit board is made.

By the forming of the resistor function according to a preferred embodiment occurring in the normal conductor path, the resistor function can also be integrated in the internal conductor layers in multilayer printed circuit board or substrates, which causes improved distribution of the thermal energy generated by the resistor function.

According to a preferred embodiment of the present invention, the reduced cross-sectional area is a reduction of the width of the conductor in the plane of the surface. The desired resistance is then obtained by an adaptation of the width of the conductor or by adaptation of the length of the narrowed portion.

The conductors are preferably formed with a narrowed portion which has been etched by an anisotropic etching technique, to such a conductor width that such a noticeable resistance level is obtained that other resistor functions are not necessary in the extent of the conductor path between the other component connections to which an applied resistor function would have been connected.

According to an alternative embodiment of the present invention, the reduced cross-sectional area is provided by at least one essentially longitudinal groove being etched in the surface of the conductor. If the grooves are etched through the entire conductor, at least two essentially parallel conductors are obtained.

A person skilled in the art realises that the anisotropic etching technique is selected among known anisotropic etching techniques. The specific application determines which etching technique is to be chosen. Examples of anisotropic etching techniques are reactive ion etching, plasma etching and different kinds of wet etching.

According to a preferred embodiment of the present invention, use is made of a wet etching technique. This is advantageous from the viewpoint of costs.

According to a special aspect of the invention, use is made of a chemically etching etching fluid, in which the etchant, which constitutes the active substance, is present in a diluted solution. Extremely good results can be produced, such as exact etchings in small dimensions. This aspect of the invention is based on the surprising discovery that an etching fluid which has been diluted to have a negligible etching effect can be used for anisotropic etching under the action of an electric field.

This results in etching of an electrically conductive etching material by means of an etchant, which is present in a solution which is diluted to such a great extent as not to be practically usable for chemical etching. The etchant concentration is so low that such reactions between the etchant and the etching material as result in the removal of atoms from the etching material occur only sporadically. By an electric field being produced in the etchant solution between the electrode and a surface portion of the etching material, a local concentration of etchant forms on the surface portion of the etching material. This results in a pronounced increase of the etching rate of the etchant while at the same time the etching direction of the etchant is affected.

The described etching method is known from PCT Application SE97/01480.

If exact resistors are to be manufactured, it is advantageous to measure the resistance of the conductor during etching. When the measured resistance conforms with the desired value, the etching is interrupted.

The above features can, of course, be combined in the same embodiment.

In order to further elucidate the invention, detailed embodiments thereof will be described below, without the invention, however, being considered to be restricted thereto.

DETAILED DESCRIPTION OF THE INVENTION

Figure 1:
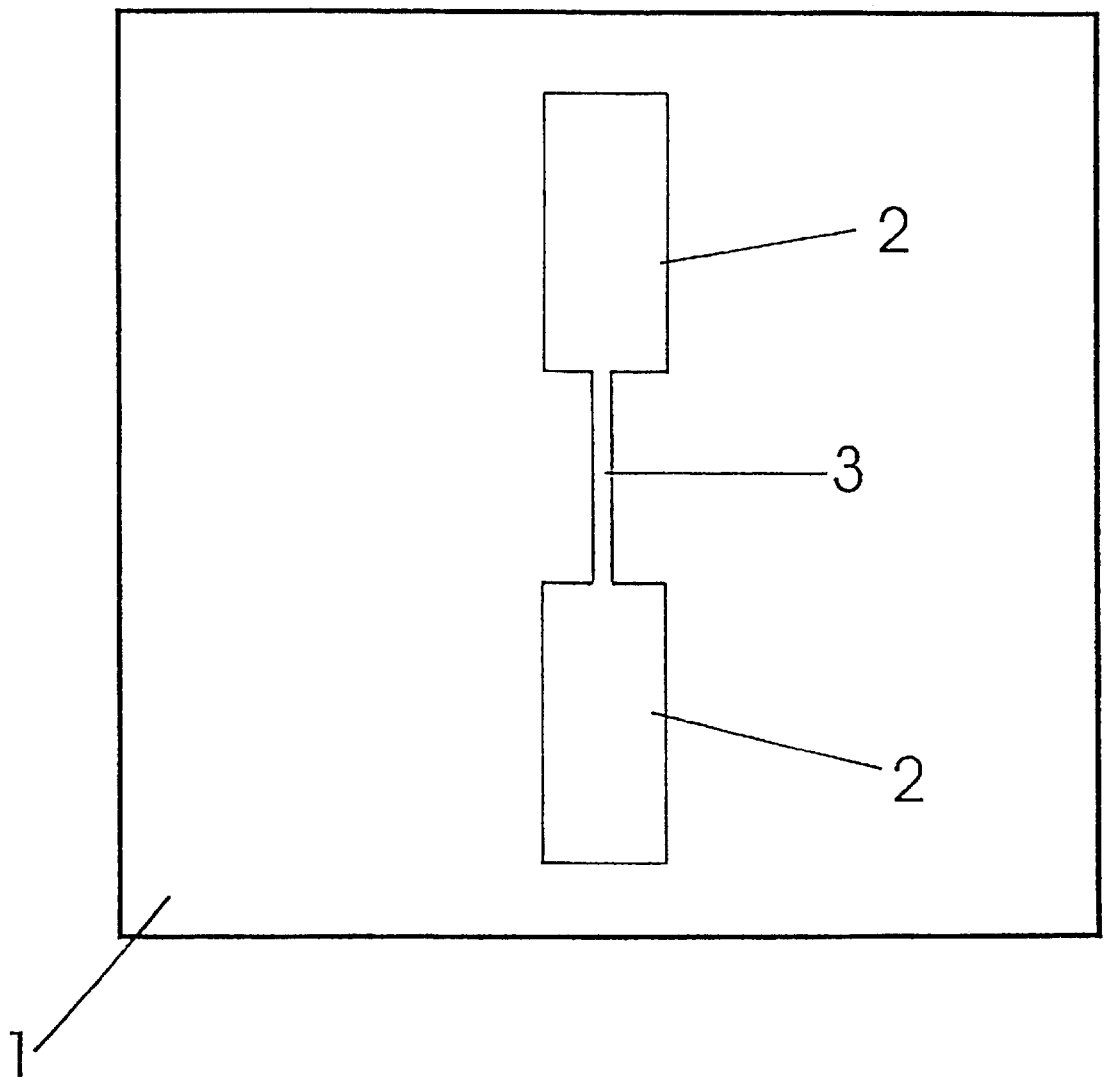
FIG. 1 illustrates a conductor on a printed circuit board, said conductor having a narrowed portion along part of the length of the conductor path, according to an embodiment of the invention.

FIG. 1 shows a printed circuit board, substrate or chip 1 which has a conductor 2 with a narrowed portion 3 to provide the intended resistance in the conductor. As a result, no separate resistor component or resistor pressure is required. The length and width of the narrowed portion have been adapted to produce the desired resistor. In the Figure, the narrowed portion has the same width over its entire length, but a person skilled in the art realises that the width may vary over the length.

Figure 2:
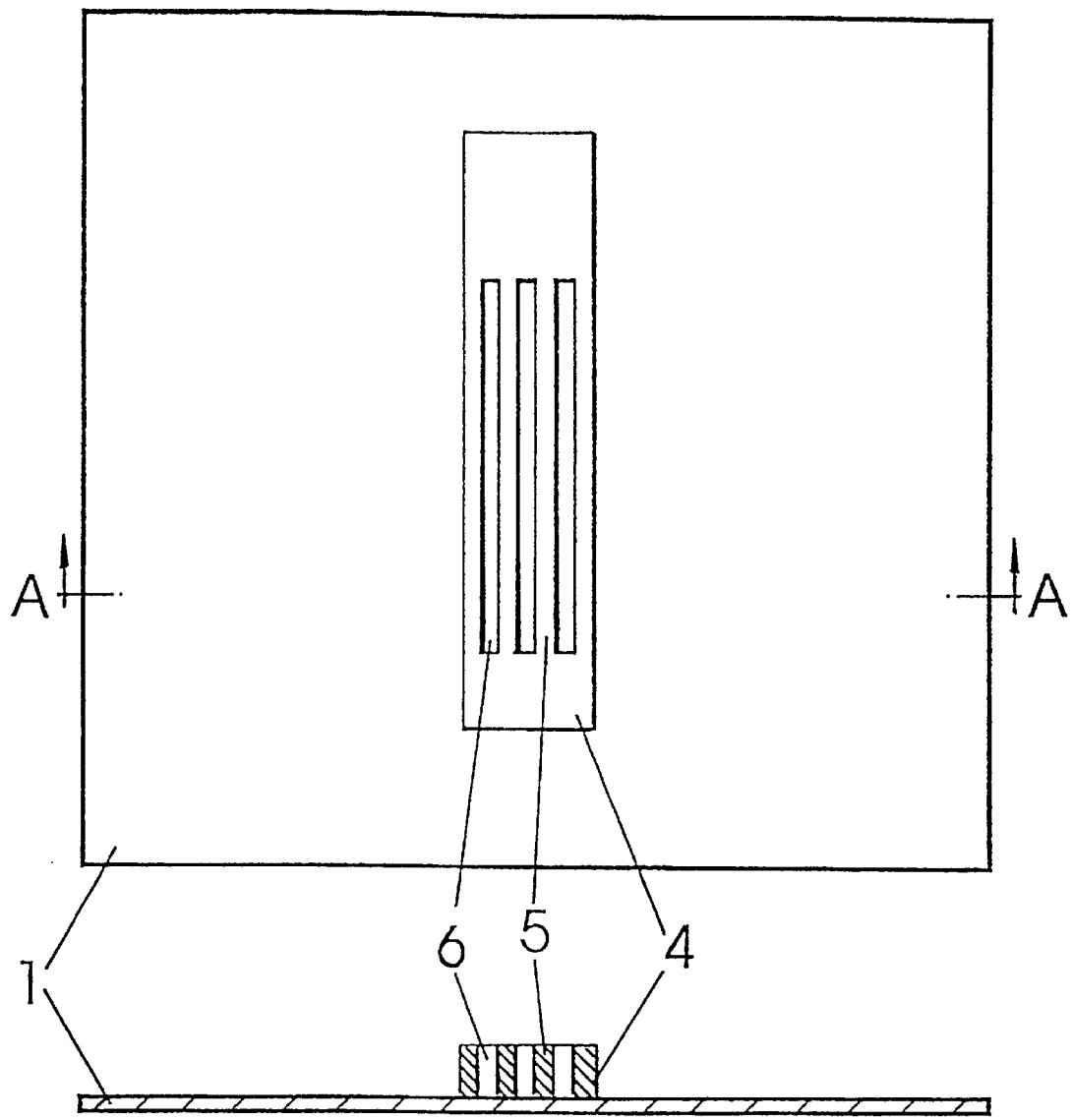
FIG. 2 illustrates a conductor on a printed circuit board, said conductor having a plurality of parallel conductor portions along part of the length of the conductor path, according to an alternative embodiment of the invention.

FIG. 2a shows a printed circuit board, substrate or chip 1 which is provided with a conductor 4. FIG. 2b is a sectional view along line A—A in FIG. 2a. This is formed with etched grooves 6, which results in the conductor 2 having narrowed conductor portions 5. This, in turn, results in the desired resistance value while at the same time the distribution of current in a plurality of conductors distributes the generation of power on a larger surface. In the Figure, the grooves are etched through the thickness of the entire conductor, but alternatively the grooves extend only partly through the thickness of the conductor.

Figure 3:
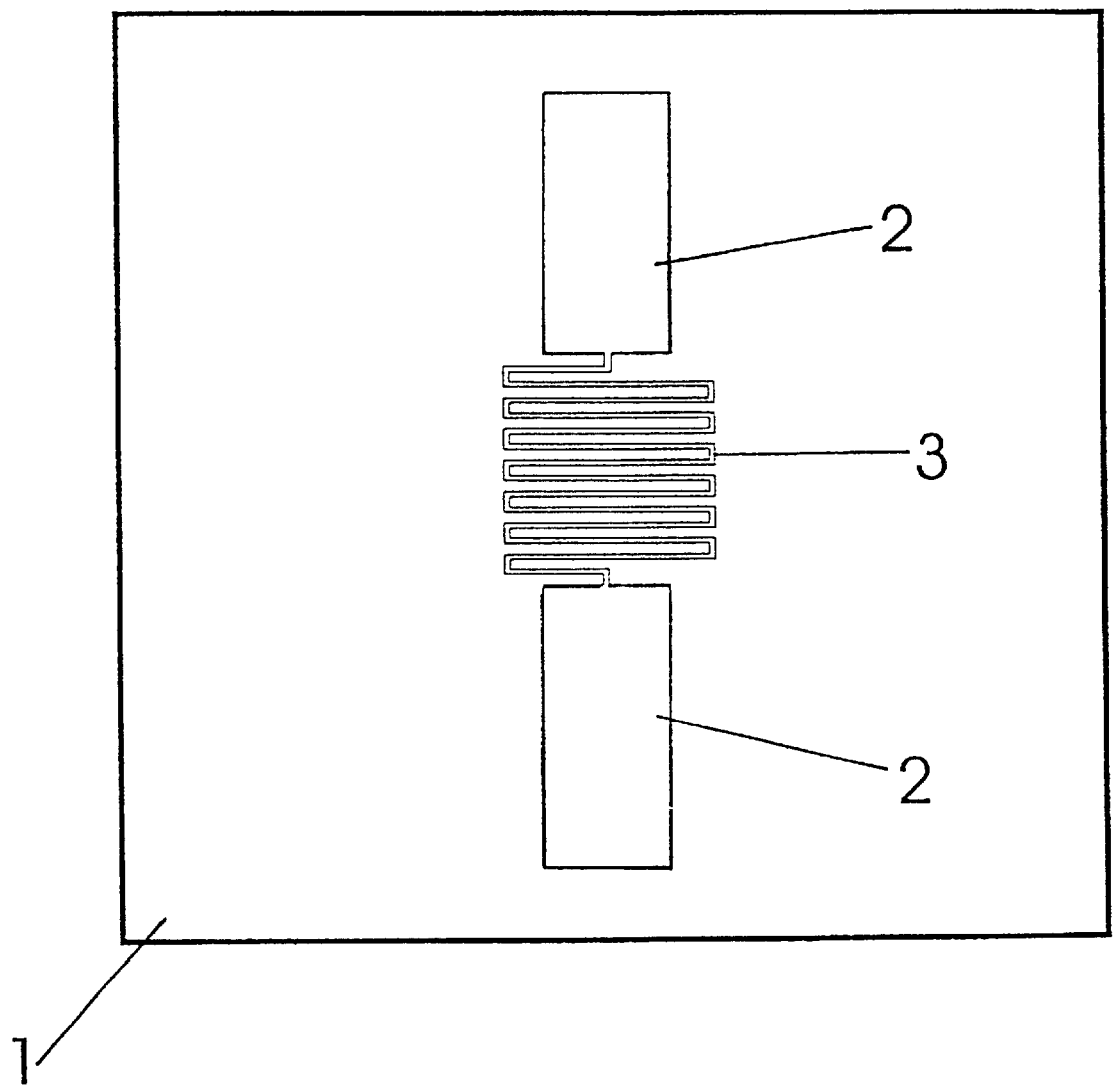
FIG. 3 illustrates a conductor on a chip, said conductor having a portion with a conductor which is narrower than the surrounding conductor portions and which is longer than the distance between the surrounding conductor portions.

FIG. 3 illustrates a printed circuit board, substrate or chip 1 which is provided with one or more conductors 2. The conductor or conductors have been formed with a narrowed conductor portion 3 which has such a great narrowing 3 in a conductor pattern prolonged in relation to the distance between the conductor paths which are not narrowing, in order to increase the resistance value.

By thus increasing the length of the conductor, the width can be greater for a certain predetermined resistance compared with the case where the conductor is made straight. The narrowed conductor portion has been distributed over a larger surface, which means that the generation of power is distributed on a larger surface, which in turn leads to a lower temperature of the conductor.

The conductor structure in FIG. 3 has been produced by masking and etching.

The embodiments described above are only to be regarded as examples. A person skilled in the art realises that the above embodiments can be varied in a number of ways without deviating from the inventive idea.

What is claimed is:

1. A method for manufacturing a resistor function in an electric conductor on a surface of a carrier comprising etching an electric conductor on a surface of a carrier using anisotropic etching to provide at least one portion in the conductor which has a smaller cross-sectional area than other portion of the conductor connected to spaced sides of the at least one portion, the length and width of the at least one portion being such that a predetermined resistance is obtained in the conductor wherein the anisotropic etching is performed by arranging an electric field in an etching fluid adjacent to the conductor, the etching fluid being present in such a diluted solution that it is not capable of etching the conductor without an electric field, but in concentrated form etches the conductor without an electric field.

2. The method of claim 1, wherein the conductor is provided with a plurality of parallel at least one portions whose total cross-sectional area is smaller than the cross-sectional area of the other portions of the conductor connected to spaced sides of said parallel portions.

3. The method of claim 1, wherein the smaller cross-sectional area consists of a reduction of the width of the at least one portion of the conductor in the plane of the surface.

4. The method of claim 1, including the steps of measuring the resistance of the conductor during etching, and interrupting the etching when the measured resistance corresponds to the predetermined resistance.

5. The method of claim 1, wherein said at least one portion in the conductor is etched so that said at least one portion has a greater length than the distance between said other portions of the conductor connected to spaced sides of the at least one portion and a smaller width than said other portions of the conductor.

* * * * *